(12) United States Patent
Ma et al.

(10) Patent No.: US 6,537,706 B1
(45) Date of Patent: Mar. 25, 2003

(54) METHOD FOR MAKING A PHOTOLITHOGRAPHIC MASK

(75) Inventors: Qing Ma, San Jose, CA (US); Jin Lee, Palo Alto, CA (US); Jun Fei Zheng, Mountain View, CA (US); Giang Dao, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/525,198

(22) Filed: Mar. 14, 2000

(51) Int. Cl.$^7$ ............... G03F 9/00; G03C 5/00
(52) U.S. Cl. ............ 430/5; 430/323; 430/296; 430/394; 378/35
(58) Field of Search ............ 430/5, 322, 323, 430/324, 296, 394; 378/34, 35

(56) References Cited

U.S. PATENT DOCUMENTS

| | | | |
|---|---|---|---|
| 5,291,536 A | * | 3/1994 | Itoh et al. ............ 378/35 |
| 5,553,110 A | * | 9/1996 | Sentoku et al. ............ 378/35 |
| 5,677,090 A | * | 10/1997 | Marumoto et al. ............ 430/5 |
| 5,773,177 A | * | 6/1998 | Ikeda et al. ............ 430/5 |

* cited by examiner

Primary Examiner—Mark F. Huff
Assistant Examiner—Saleha R. Mohamedulla
(74) Attorney, Agent, or Firm—Mark V. Seeley

(57) ABSTRACT

A method for making a photolithographic mask. The method comprises forming a film on a substrate that deforms the substrate, and applying a deformation reducing agent to the substrate to reduce the amount of deformation that the film caused. In a preferred embodiment, the deformation reducing agent comprises one or more films, which are formed on one side of the substrate, that balance the substrate deformation effect of one or more films that are deposited on the other side of the substrate. The film or films that constitute the deformation reducing agent may be similar to, or different from, an absorption film and/or any other films deposited on the substrate or on the absorption film.

2 Claims, 4 Drawing Sheets

METHOD FOR MAKING A PHOTOLITHOGRAPHIC MASK

FIELD OF THE INVENTION

The present invention relates to a method for making masks used in photolithography for making semiconductors. In particular, the present invention relates to a method for making such a mask that is unaffected by substrate deformation.

BACKGROUND OF THE INVENTION

When making a photolithographic mask, absorption film 101 and photoresist layer 102 may be deposited on substrate 100, as shown in FIG. 1a. The stresses those layers apply to substrate 100 can deform it by bending it. That deformation could cause displacement errors that render the resulting mask unsuitable for generating sub 0.1 micron features.

FIGS. 1b–1e illustrate how such deformation can produce unacceptable displacement errors. After film 101 and layer 102 are formed, an e-beam writing step is performed to define those portions of photoresist layer 102 that will be removed prior to etching absorption film 101. That e-beam writing step is thus applied to a deformed substrate. The resulting structure is shown in FIG. 1b. The photoresist is then developed, generating the structure shown in FIG. 1c. Removing part of photoresist layer 102 releases some of the stress, causing substrate 100 to deform relative to its shape during the e-beam writing step. In essence, the substrate starts to "snap back" from the bent position it assumed during that step.

Next, absorption film 101 is etched (FIG. 1d) and the remaining portions of photoresist layer 102 are removed (FIG. 1e). These steps release additional stress, causing substrate 100 to further deform relative to its shape during the e-beam writing step. By applying the e-beam writing step to a bent substrate, which subsequently snaps back toward its initial shape (i.e., its shape prior to the deposition of film 101 and layer 102), the resulting mask defines features that are displaced from where they had been prescribed by the e-beam writing step.

FIG. 2 provides a graphical representation for how this process can cause displacement errors. Depositing film 101 and layer 102 (steps 201 and 202, respectively) applies stresses that cause in plane distortion 210 and 211, respectively. After the e-beam writing step (step 203), photoresist removal, absorption film etching, and photoresist stripping steps (steps 204, 205, and 206, respectively) release stress, which causes substrate 100 to return toward its initial shape. This can cause features, demarcated by the e-beam writing step, to be displaced relative to features that the resulting mask defines.

Accordingly, there is a need for a method for making a photolithographic mask that reduces the deformation caused by depositing films on a substrate. The present invention provides such a method.

DETAILED DESCRIPTION OF THE PRESENT INVENTION

A method for making a photolithographic mask is described. That method comprises forming a film on a substrate that deforms the substrate, and applying a deformation reducing agent to the substrate to reduce the amount of deformation that the film caused. In the following description, specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

In a preferred embodiment of the present invention, the film comprises an absorption film that is deposited on one side of the substrate and the deformation reducing agent comprises a second film that is deposited on the other side of the substrate. (Although such films are preferably deposited, they may be applied to the surface of the substrate in other ways without departing from the spirit and scope of the present invention.) FIGS. 3a–3d illustrate such a preferred embodiment in which the absorption film and the film employed as the deformation reducing agent comprise similar materials. FIGS. 4a–4e illustrate such a preferred embodiment in which the absorption film and the film employed as the deformation reducing agent comprise different materials.

Figure 1A:
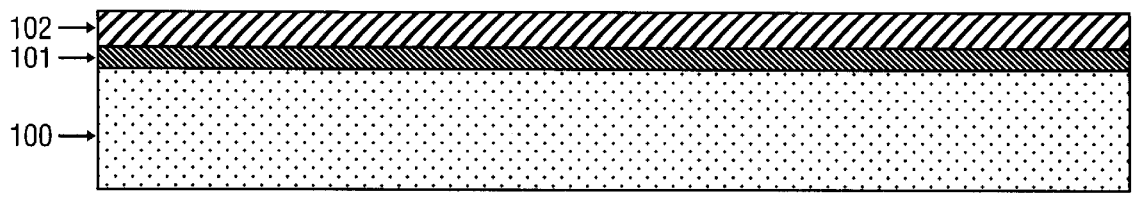
FIGS. 1a–1e represent cross-sections that illustrate a current method for making a photolithographic mask.
Figure 1B:
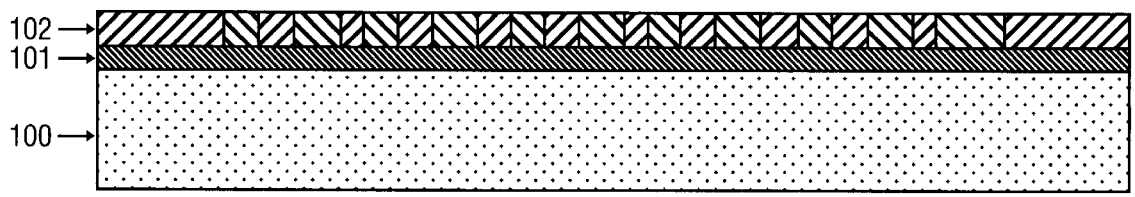
Figure 1C:
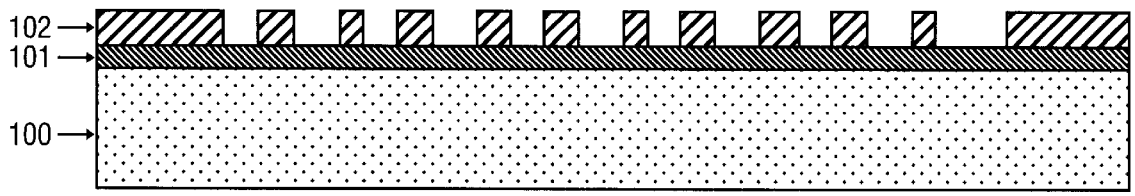
Figure 1D:
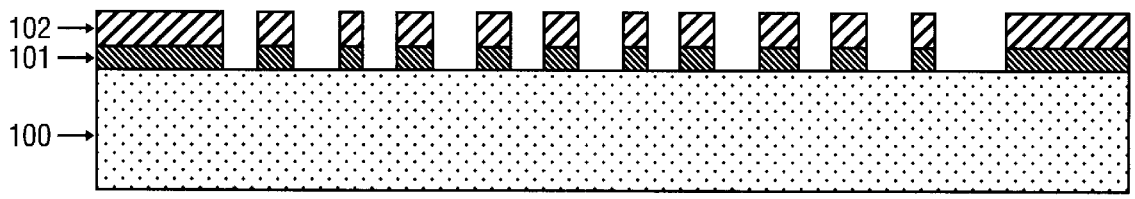
Figure 1E:
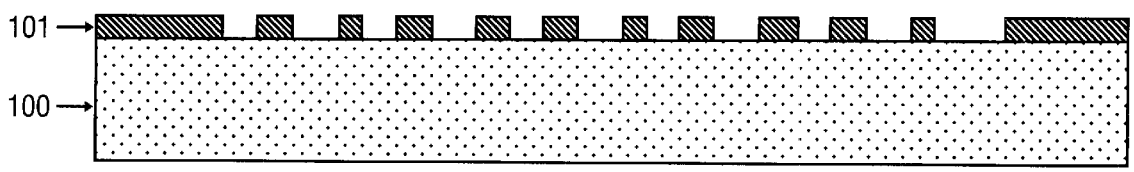
Figure 2:
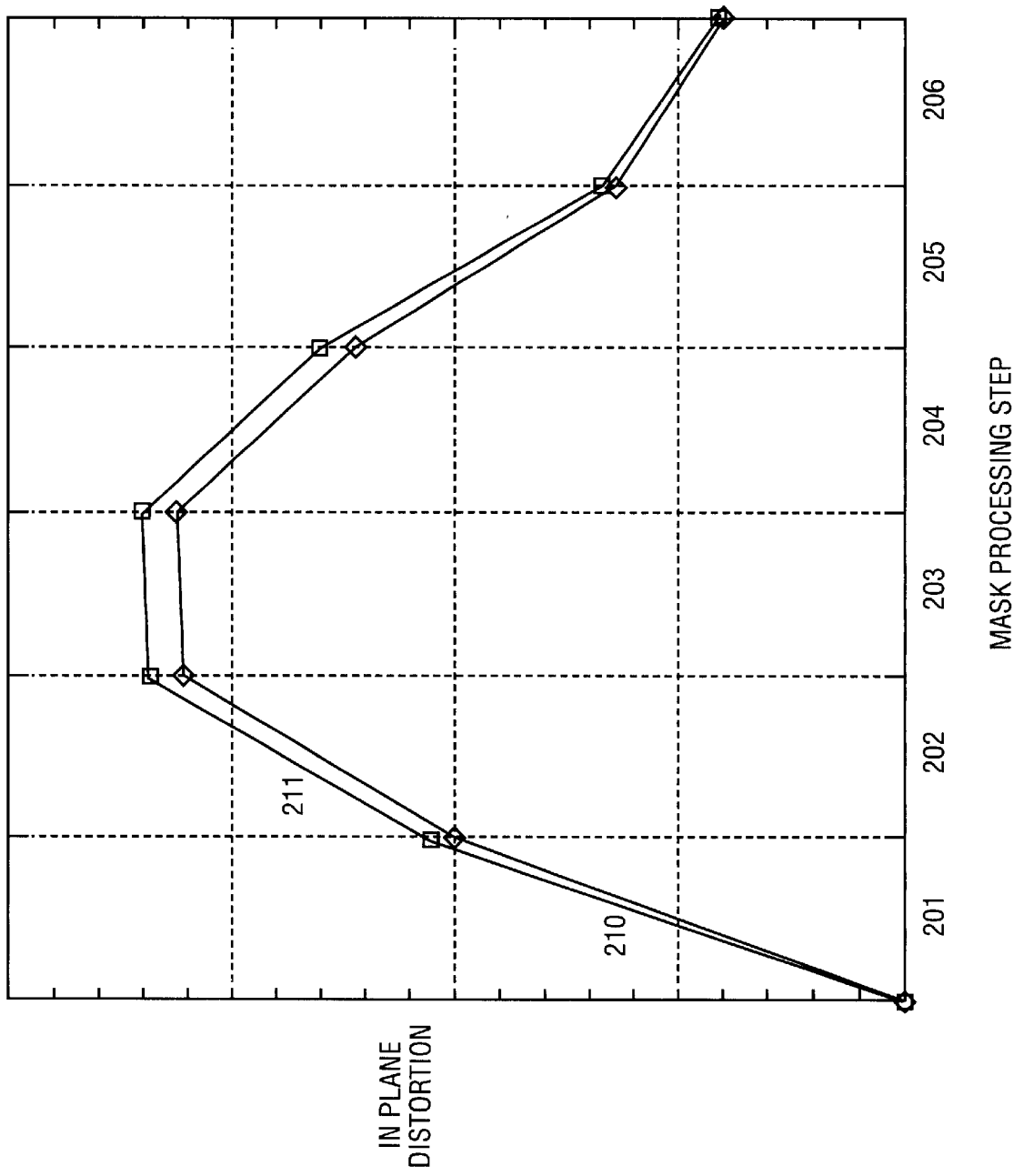
FIG. 2 is a graph that illustrates how substrate deformation can cause displacement errors.
Figure 3A:
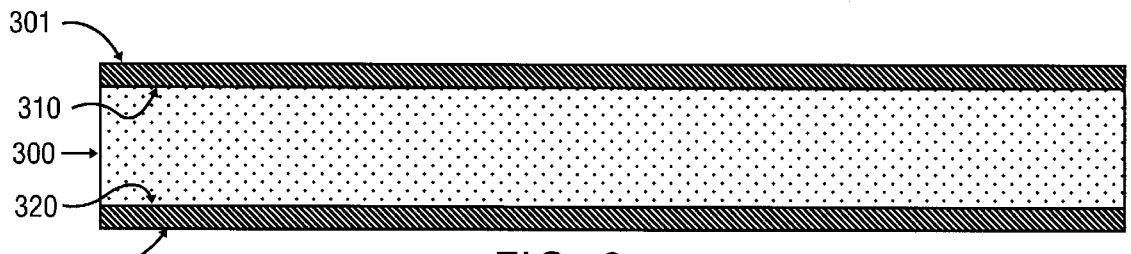
FIGS. 3a–3d represent cross-sections that illustrate one embodiment of the method of the present invention for making a photolithographic mask.

With reference to FIG. 3a, absorption film 301 is formed, e.g., deposited, on first side 310 of substrate 300. When forming a transmissive mask, substrate 300 preferably is made of quartz. When forming a reflective mask, substrate 300 may comprise silicon, or a material that has a relatively low coefficient of thermal expansion ("CTE"), such as a titanium silicate or ceramic glass. A relatively thin silicon layer may be formed on such a low CTE material, when such a material is used to form substrate 300. Although these materials may be preferred for making substrate 300, other materials may be used instead, as is well known to those skilled in the art. Substrate 300 should be thick enough to provide adequate structural support for the mask.

Substrate 300 may further comprise one or more layers formed on the surface of the bulk supporting structure. When forming a reflective mask, substrate 300 may comprise a reflective coating. Such a coating may include alternating layers of molybdenum and silicon, as will be apparent to those skilled in the art. Substrate 300 may also comprise various buffer, etch stop, or defect absorbing layers, which are formed on the bulk portion of substrate 300.

Film 301 may be deposited on substrate 300 using conventional materials and process steps, as is well known to those skilled in the art. Film 301 preferably is between about 500 and about 5,000 angstroms thick. Preferred materials for forming film 301 include chromium, titanium, tungsten, tantalum, aluminum—or other materials that provide the required light-absorbing properties. (When forming a reflective mask, the film may comprise alternating layers of reflective and transmissive materials, e.g., layers of molybdenum and silicon, which have been formed on a transparent substrate, then etched to define reflective and transmissive regions.)

Depositing film 301 on substrate 300 causes substrate 300 to bend, as explained above. To counter that effect, absorption film 302 is formed, e.g., deposited, on second side 320 of substrate 300. In this embodiment of the present invention, absorption film 302 is formed using the same materials and process steps used to form film 301, and is formed at substantially the same thickness. For example, if absorption film 301 is made of chromium, then absorption film 302 is likewise made of chromium.

When films 301 and 302 comprise substantially the same material, and have substantially the same thickness, the stress that film 301 applies to first side 310 is counter-balanced by the stress that film 302 applies to second side 320. The net effect is that substrate 300 (as shown in FIG. 3a to be sandwiched between films 301 and 302) does not sustain any significant deformation. Film 301 may be formed on substrate 300 prior to forming film 302 on substrate 300, film 302 may be formed prior to forming film 301, or both films may be formed on substrate 300 at substantially the same time.

Figure 3B:
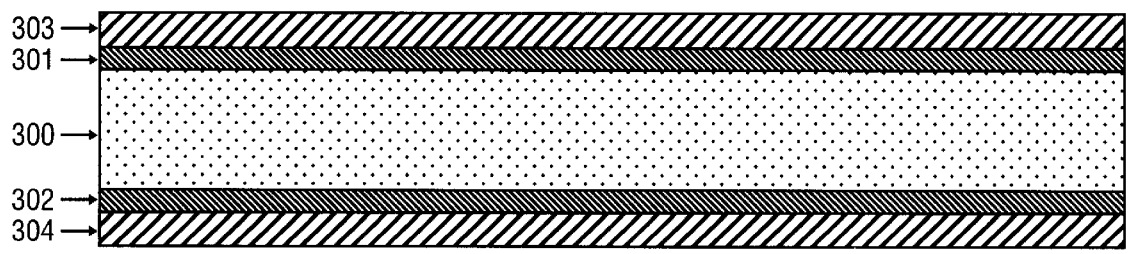

After films 301 and 302 are formed on substrate 300, photoresist layers 303 and 304 are deposited on them (e.g., via a conventional spin and cure process) to produce the structure shown in FIG. 3b. As a result, stresses applied to substrate 300 continue to be counter-balanced. Layer 303 may be applied to film 301 prior to applying layer 304 to film 302, or layer 304 may be formed on film 302 prior to forming layer 303 on film 301.

Figure 3C:
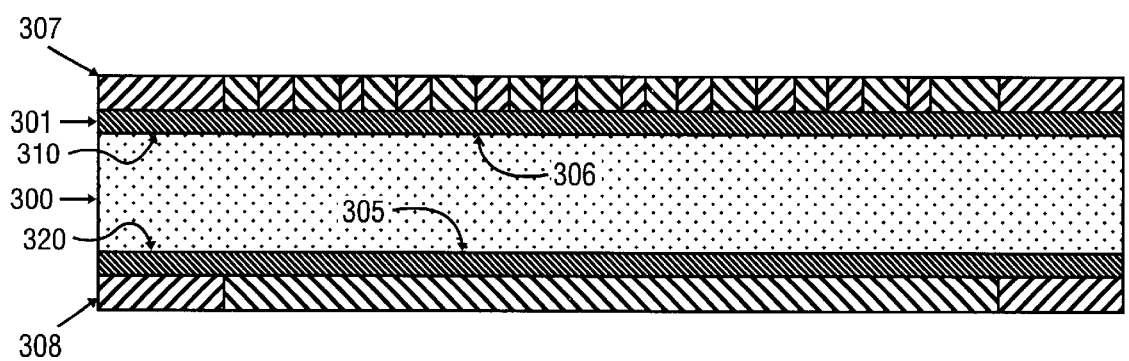
Figure 3D:
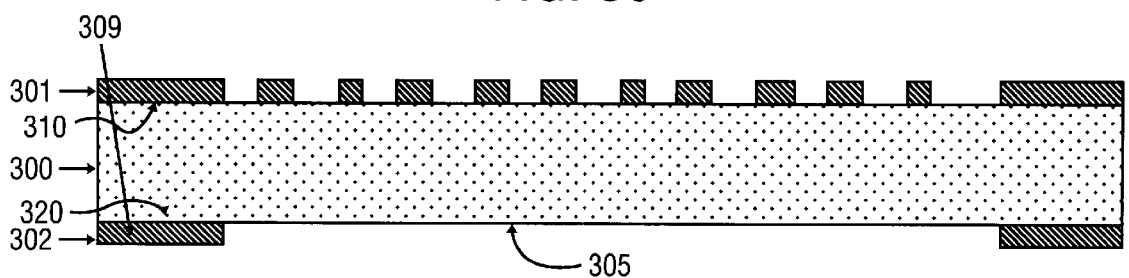

Next, an e-beam writing step is applied to first side 310 of substrate 300 to define those portions of absorption film 301 that will be etched. In this embodiment, an e-beam writing step is also applied to second side 320 of substrate 300, as shown in FIG. 3c. This defines portion 305 of second side 320, from which substantially all of film 302 will be removed. On corresponding portion 306 of first side 310 some portions of film 301 will be removed and some portions retained. Photoresist sections 307 and 308 define borders that will provide boundaries for portions 305 and 306. These e-beam writing steps may be performed in either order.

Next, photoresist layers 303 and 304 are developed to rinse away unwanted portions. After the photoresist is developed, absorption film 301 is etched using conventional materials, equipment and process steps. Film 302 is then etched. Because none of film 302, where located on first portion 305, was protected by photoresist, all (or at least substantially all) of that portion of film 302 is removed. Afterwards, the remainder of photoresist layers 303 and 304 are stripped, creating the structure represented by FIG. 3d. These photoresist developing, film etching, and photoresist stripping steps each may be performed on first side 310 prior to second side 320, on second side 320 prior to first side 310, or on both sides 310 and 320 at substantially the same time. Subsequent processing may follow to complete the mask, e.g., adding on top of absorption layer 301 certain phase shifting materials, transmissive capping layers, etc. . . .

This double-sided process balances the stresses that are applied to both sides of substrate 300, while the mask is being made. This process thus ensures that the displacement between features, as prescribed by the e-beam writing step and as defined by the finished mask, will be insignificant. In this regard, although retaining portions of absorption film 301 on first side 310—while removing corresponding portions of film 302 from second side 320—yields an asymmetric mask, the bending due to such asymmetry is insignificant. To minimize that effect, border 309 should be retained on second side 320.

Figure 4A:
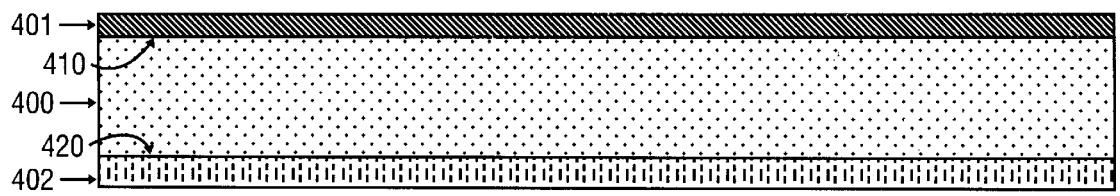
FIGS. 4a–4e represent cross-sections that illustrate another embodiment of the method of the present invention for making a photolithographic mask.

FIGS. 4a–4e illustrate a preferred embodiment of the present invention in which the absorption film and the film employed as the deformation reducing agent comprise different materials. With reference to FIG. 4a, absorption film 401 is formed, e.g., deposited, on first side 410 of substrate 400. As in the FIG. 3 embodiment, film 401 is preferably between about 500 and about 5,000 angstroms thick. To counter the bending effect that film 401 has on substrate 400, film 402 is formed, e.g., deposited, on second side 420 of substrate 400. In this embodiment of the present invention, film 402 is formed using materials that differ from those that were used to form film 401. For example, if film 401 is made from chromium, then film 402 may be made from titanium, or other films that can provide the desired counter-balancing effect, while being relatively easy to remove from substrate 400. Film 402 may be thicker than film 401, if film 402 must balance the stress that the combination of film 401 and a later deposited photoresist layer apply to substrate 400.

Figure 4B:
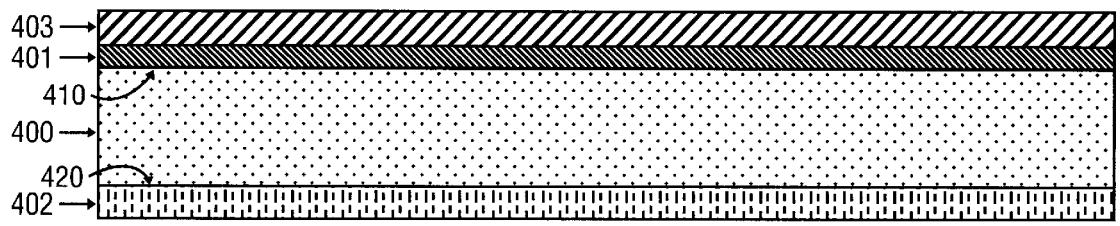
Figure 4C:
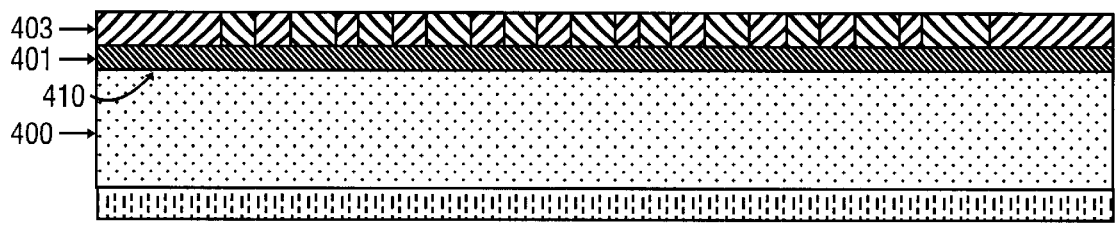
Figure 4D:
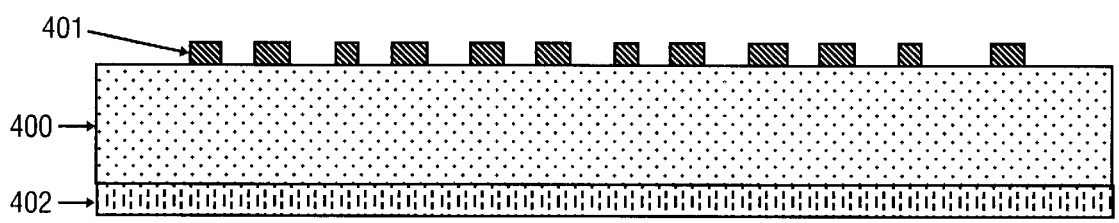
Figure 4E:
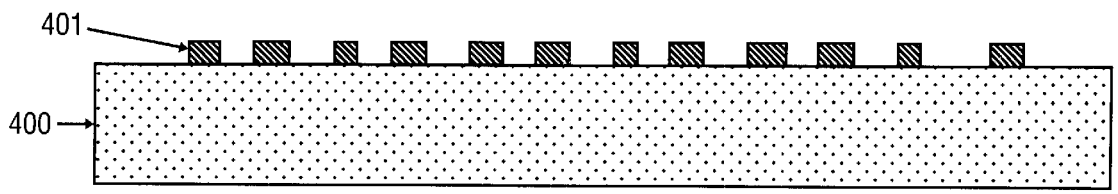

In this embodiment, after films 401 and 402 are formed on substrate 400, photoresist layer 403 is deposited on film 401 to produce the structure shown in FIG. 4b. As just mentioned, a material and a thickness may be chosen for film 402 such that the stress film 401 and layer 403 apply to first side 410 is counter-balanced by the stress film 402 applies to second side 420. Although, in this embodiment, this counter-balancing effect is provided by single layer film 402, two or more films may be used instead to perform this function. The net effect is that substrate 400 does not sustain any significant deformation.

Although in a preferred embodiment of the present invention, layers are deposited in the following order: film 401, then film 402, then layer 403, the deposition sequence may be altered. For example, film 402 may be formed prior to forming film 401. Likewise, layer 403 may be applied to film 401 before film 402 is deposited on substrate 400. The order of deposition is thus not critical, so long as those steps ultimately generate the counter-balanced structure represented by FIG. 4b.

Next, an e-beam writing step is applied to first side 410 of substrate 400 to define those portions of absorption film 401 that will be etched. This yields the structure illustrated in FIG. 4c. Next, photoresist layer 403 is developed, which removes resist over those regions of absorption film 401 that will be etched away. Absorption film 401 is then etched, and the remaining portion of photoresist layer 403 is stripped, producing the structure represented by FIG. 4d. Film 402 is then removed, generating the structure shown in FIG. 4e. The photoresist developing, film 401 etching, photoresist stripping, and film 402 removal steps may be performed using conventional materials, equipment and processes. The order in which those steps are performed may differ from the order described here.

Although retained portions of absorption film 401 produce an asymmetric mask, those portions apply negligible stress to the substrate. As a consequence, any bending of the substrate due to such asymmetry is insignificant—relative to either the substrate's initial shape, or the shape that the substrate assumed during the e-beam writing step. For that reason, meaningful displacement error is avoided.

An improved method for making a photolithographic mask has been described. This method applies a counter-balancing technique to ensure that stresses applied by the absorption film and photoresist layer to one side of the substrate do not cause unacceptable deformation of the substrate, which can lead to undesirable feature displacement errors.

Although the foregoing description has specified a method that includes certain steps, those skilled in the art will appreciate that many modifications and substitutions may be made. For example, the nature and number of layers formed on each side of the substrate may vary from those described above. In that regard, the present invention comprehends any method that reduces the amount of deformation resulting from forming various films on a substrate, when forming a photolithographic mask. Accordingly, it is intended that all such modifications, alterations, substitutions and additions be considered to fall within the spirit and scope of the invention as defined by the appended claims.

What is claimed is:

1. A method for making a photolithographic mask comprising:

depositing an absorption film on a first side of a substrate;

depositing a second film on a second side of the substrate;

depositing a first layer of photoresist on the absorption film;

depositing a second layer of photoresist on the second film;

patterning the first layer of photoresist to define portions of the absorption film to be etched;

etching the absorption film;

stripping the remainder of the photoresist from the etched absorption film;

wherein the second film is deposited on the second side of the substrate after the absorption film is deposited on the first side of the substrate and the second layer of photoresist is deposited on the second film after the first layer of photoresist is deposited on the absorption film;

wherein the absorption film and the second film are deposited on the first and second sides of the substrate, respectively, using the same process and the same materials to generate films having the same thickness;

wherein a first e-beam writing step is applied to define the portions of the absorption film to be etched;

applying a second e-beam writing step to the second photoresist layer after the first e-beam writing step; and removing substantially all of the second film from a portion of the second side of the substrate, while retaining portions of the absorption film on the corresponding portion of the first side of the substrate.

2. The method of claim 1 wherein the second film is removed from the portion of the second side of the substrate after the absorption film has been etched.

* * * * *